(12) United States Patent
Zhou et al.

(10) Patent No.: US 10,644,036 B2
(45) Date of Patent: May 5, 2020

(54) VA TYPE TFT ARRAY SUBSTRATE AND THE MANUFACTURING METHOD THEREOF

(71) Applicant: Shenzhen China Star Optoelectronics Semiconductor Display Technology Co., Ltd., Shenzhen (CN)

(72) Inventors: Zhichao Zhou, Shenzhen (CN); Hui Xia, Shenzhen (CN); Meng Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 294 days.

(21) Appl. No.: 15/748,631

(22) PCT Filed: Dec. 20, 2017

(86) PCT No.: PCT/CN2017/117349
§ 371 (c)(1),
(2) Date: Jan. 29, 2018

(87) PCT Pub. No.: WO2019/100496
PCT Pub. Date: May 31, 2019

(65) Prior Publication Data
US 2020/0096799 A1    Mar. 26, 2020

(30) Foreign Application Priority Data
Nov. 22, 2017  (CN) .......................... 2017 1 1175845

(51) Int. Cl.
*H01L 27/12* (2006.01)
*G02F 1/1362* (2006.01)
*H01L 29/786* (2006.01)

(52) U.S. Cl.
CPC ...... *H01L 27/124* (2013.01); *G02F 1/136227* (2013.01); *G02F 1/136286* (2013.01);
(Continued)

(58) Field of Classification Search
CPC ......... H01L 29/78696; H01L 29/78642; H01L 27/1251; H01L 29/42384
See application file for complete search history.

(56) References Cited

U.S. PATENT DOCUMENTS

2002/0008239 A1* 1/2002 Hayashi .............. H01L 29/4908
257/72
2005/0258427 A1* 11/2005 Chan .................. H01L 29/66787
257/72

(Continued)

*Primary Examiner* — Changhyun Yi
(74) *Attorney, Agent, or Firm* — Leong C. Lei

(57) ABSTRACT

The present invention provides a VA type TFT array substrate and a manufacturing thereof. The manufacturing method for a VA type TFT array substrate of the present invention comprises that three pixel electrodes are formed in one pixel. The three pixel electrodes are connected to the same TFT but located on different structure layers. Therefore, the driving capabilities to liquid crystals are different. In the present invention, the three pixel electrodes are used to adjust the liquid crystal transmittances of three regions in one pixel, which is beneficial of keeping the brightness uniformity of the pixel when seeing from different angels, thereby enhancing the viewing angle of the VA type LCDs. The VA type TFT array substrate of the present invention disposes three pixel electrodes are formed in one pixel, which is beneficial of enhancing the viewing angle of the VA type LCDs.

11 Claims, 16 Drawing Sheets

(52) U.S. Cl.
CPC .... *H01L 27/1251* (2013.01); *H01L 29/78642* (2013.01); *H01L 29/78696* (2013.01)

(56) References Cited

U.S. PATENT DOCUMENTS

2011/0157509 A1\* 6/2011 Kim .................. G02F 1/136209
  349/47
2015/0236043 A1\* 8/2015 Shi ........................ H01L 27/124
  257/390

\* cited by examiner

VA TYPE TFT ARRAY SUBSTRATE AND THE MANUFACTURING METHOD THEREOF

BACKGROUND OF THE INVENTION

Field of Invention

The present invention relates to the field of display technology, and more particularly to a vertical alignment (VA) thin film transistor (TFT) array substrate and a manufacturing thereof.

Description of Prior Art

Liquid crystal displays (LCDs) such as flat panel display devices are widely used in mobile phones, televisions, personal digital assistants, digital cameras, notebooks, desktop, other consumer electronics products and etc. for high quality, power saving, thin body and wide application range. The LCDs has become the mainstream in display device.

Most of the liquid crystal display (LCD) devices on the market are backlight type LCDs, which comprise a LCD panel and a backlight module. In general, the LCD panel is composed of a color filter (CF) substrate, a thin film transistor (TFT) substrate, a liquid crystal (LC) sandwiched between the CF substrate and the TFT substrate, and a sealant frame sealant.

TFT-LCDs can be mainly classified into three types, a twist nematic/super twist nematic (TN/STN), an in-plane switching (IPS), and a vertical alignment (VA). Among them, the VA type LCD has an extremely high contrast with respect to other types of LCDs; the contrast is generally up to 4000-8000, which has very wide application range in large-size displays such as television. However, the viewing angle of a VA type LCD is smaller than other types LCDs. When the display is viewed from different directions, the brightness of some areas increases and the brightness of some areas decreases, resulting in image distortion, which hinders the development and application of the VA type LCD.

SUMMARY OF THE INVENTION

An object of the present invention is to provide a method for fabricating a VA type TFT array substrate, which is beneficial to increase the viewing angle of VA type LCD.

An object of the present invention is to further provide a VA type TFT array substrate, which is beneficial to increase the viewing angle of VA type LCD.

In order to achieve the object, the present invention provides a manufacturing method for an VA type TFT array substrate, which comprises:

S1, A base substrate is provided. A gate electrode, a scanning line, and a first pixel electrode are formed on the base substrate by using a first photomask process. The scanning line is connected with the gate electrode.

S2, A gate insulating layer is deposited on the gate electrode, the scanning line, the first electrode, and the base substrate. A semiconductor layer is deposited on the gate insulating layer. The semiconductor layer is patterned by using a second photomask process, so as to obtain an active layer corresponding onto the gate electrode.

S3, A drain electrode, a source electrode, a data line, and a second pixel electrode on the active layer and the gate insulating layer by using a third photomask process. The drain electrode and the source electrode are respectively in contact with the active layer. The data line is connected with the source electrode. The drain electrode is connected with the second pixel electrode S4, A passivation layer is formed on the drain electrode, the source electrode, the data line, the second pixel electrode, the active layer, and the gate insulating layer. The passivation layer and the gate insulating layer are patterned by using a fourth photomask process, so as to obtain a first through hole and a second through hole located on the passivation layer, and a third through hole located on the passivation layer and the gate insulating layer. The first through hole and the second through hole are disposed corresponding onto the drain electrode. The third through hole is corresponding onto the first pixel electrode.

S5, A third transparent conductive layer is deposited on the passivation layer, and the third transparent conductive layer is patterned by using a fifth photomask process, so as to obtain a third pixel electrode and a conductive connection layer. The third pixel electrode is connected with the drain electrode via the first through hole. The conductive connection layer is connected with the drain electrode via the second through hole and connected with the first pixel electrode via the third through hole, so that the drain electrode and the first pixel electrode are connected.

The S1 specifically comprises:

S11, The base substrate is provided and a first transparent conductive layer is deposited on the base substrate. The first transparent conductive layer is patterned by using the first photomask process, so as to obtain a predetermined pattern of the gate electrode and a predetermined pattern of the scanning line, and the first pixel electrode.

A first metal layer is plated on the predetermined pattern of the gate electrode and the predetermined pattern of the scanning line, so as to obtain the gate electrode and the scanning line. A conductivity of the first metal layer is greater than a conductivity of the first transparent conductive layer.

The first transparent conductive layer is selected from the group consisting of transparent conductive metal oxide. The first metal layer is selected from the group consisting of copper. A process of plating a first metal layer on the predetermined pattern of the gate electrode and the predetermined pattern of the scanning line is an electroplating process.

The S3 specifically comprises:

S31, a second transparent conductive layer are deposited on the active layer and the gate insulating layer. The second transparent conductive layer is patterned by using the third photomask process, so as to obtain a predetermined pattern of the source electrode and a predetermined pattern of the data line, the drain electrode, and the second pixel electrode.

S32, a second metal layer is plated on the predetermined pattern of the source electrode and the predetermined pattern of the data line, so as to obtain the source electrode and the data line. A conductivity of the second metal layer is greater than a conductivity of the second transparent conductive layer.

The second transparent conductive layer is selected from the group consisting of transparent conductive metal oxide; and the second metal layer is selected from the group consisting of copper. A process of plating a second metal layer on the predetermined pattern of the source electrode and the predetermined pattern of the data line is an electroplating process.

The present invention further provides an VA type TFT array substrate, which comprises:

A base substrate.

A gate electrode, a scanning line, and a first pixel electrode are disposed on the base substrate. The scanning line is connected with the gate electrode.

A gate insulating layer is disposed on the gate electrode, the scanning line, the first pixel electrode, and the base substrate.

An active layer is disposed on the gate insulating layer and corresponding onto the gate electrode.

A drain electrode and a source electrode are disposed on the active layer and the gate insulating layer. A data line and a second pixel electrode are disposed on the gate insulating layer. The drain electrode and the source electrode are respectively in contact with the active layer. The data line is connected with the source electrode. The drain electrode is connected with the second pixel electrode.

A passivation layer is disposed on the drain electrode, the source electrode, the data line, the second pixel electrode, the active layer, and the gate insulating layer. A first through hole and a second through hole are disposed on the passivation layer and corresponding onto the drain electrode. The third through hole is disposed corresponding onto the first pixel electrode.

A third pixel electrode and a conductive connection layer are disposed on the passivation layer. The third pixel electrode is connected with the drain electrode via the first through hole. The conductive connection layer is connected with the drain electrode via the second through hole and connected with the first pixel electrode via the third through hole, so that the drain electrode and the first pixel electrode are connected.

The first pixel electrode comprises a first transparent conductive layer. The gate electrode and the scanning line comprise the first transparent conductive layer and a first metal layer on the first transparent conductive layer. A conductivity of the first metal layer is greater than a conductivity of the first transparent conductive layer.

The first transparent conductive layer is selected from the group consisting of transparent conductive metal oxide. The first metal layer is selected from the group consisting of copper.

The second pixel electrode and the drain electrode comprise a second transparent conductive layer. The source electrode and the data line comprise the second transparent conductive layer and a second metal layer on the second transparent conductive layer. A conductivity of the second metal layer is greater than a conductivity of the second transparent conductive layer.

The present invention further provides another manufacturing method for an VA type TFT array substrate, which comprises:

S1, A base substrate is provided. A gate electrode, a scanning line, and a first pixel electrode are formed on the base substrate by using a first photomask process. The scanning line is connected with the gate electrode.

S2, A gate insulating layer is deposited on the gate electrode, the scanning line, the first electrode, and the base substrate. A semiconductor layer is deposited on the gate insulating layer. The semiconductor layer is patterned by using a second photomask process, so as to obtain an active layer corresponding onto the gate electrode.

S3, A drain electrode, a source electrode, a data line, and a second pixel electrode on the active layer and the gate insulating layer by using a third photomask process. The drain electrode and the source electrode are respectively in contact with the active layer. The data line is connected with the source electrode. The drain electrode is connected with the second pixel electrode S4, A passivation layer is formed on the drain electrode, the source electrode, the data line, the second pixel electrode, the active layer, and the gate insulating layer. The passivation layer and the gate insulating layer are patterned by using a fourth photomask process, so as to obtain a first through hole and a second through hole located on the passivation layer, and a third through hole located on the passivation layer and the gate insulating layer. The first through hole and the second through hole are disposed corresponding onto the drain electrode. The third through hole is corresponding onto the first pixel electrode.

S5, A third transparent conductive layer is deposited on the passivation layer, and the third transparent conductive layer is patterned by using a fifth photomask process, so as to obtain a third pixel electrode and a conductive connection layer. The third pixel electrode is connected with the drain electrode via the first through hole. The conductive connection layer is connected with the drain electrode via the second through hole and connected with the first pixel electrode via the third through hole, so that the drain electrode and the first pixel electrode are connected.

Wherein the S1 specifically comprises:

S11, The base substrate is provided and a first transparent conductive layer is deposited on the base substrate. The first transparent conductive layer is patterned by using the first photomask process, so as to obtain a predetermined pattern of the gate electrode and a predetermined pattern of the scanning line, and the first pixel electrode.

A first metal layer is plated on the predetermined pattern of the gate electrode and the predetermined pattern of the scanning line, so as to obtain the gate electrode and the scanning line. A conductivity of the first metal layer is greater than a conductivity of the first transparent conductive layer.

Wherein the first transparent conductive layer is selected from the group consisting of transparent conductive metal oxide. The first metal layer is selected from the group consisting of copper. A process of plating a first metal layer on the predetermined pattern of the gate electrode and the predetermined pattern of the scanning line is an electroplating process.

Wherein the S3 specifically comprises:

S31, a second transparent conductive layer are deposited on the active layer and the gate insulating layer. The second transparent conductive layer is patterned by using the third photomask process, so as to obtain a predetermined pattern of the source electrode and a predetermined pattern of the data line, the drain electrode, and the second pixel electrode.

S32, a second metal layer is plated on the predetermined pattern of the source electrode and the predetermined pattern of the data line, so as to obtain the source electrode and the data line. A conductivity of the second metal layer is greater than a conductivity of the second transparent conductive layer.

Wherein the second transparent conductive layer is selected from the group consisting of transparent conductive metal oxide; and the second metal layer is selected from the group consisting of copper. A process of plating a second metal layer on the predetermined pattern of the source electrode and the predetermined pattern of the data line is an electroplating process.

The beneficial effects of the present invention are: The manufacturing method for a VA type TFT array substrate of the present invention comprises that three pixel electrodes are formed in one pixel. The three pixel electrodes are connected to the same TFT but located on different structure layers. Therefore, the driving capabilities to liquid crystals are different. In the present invention, the three pixel electrodes are used to adjust the liquid crystal transmittances of three regions in one pixel, which is beneficial of keeping the brightness uniformity of the pixel when seeing from different angels, thereby enhancing the viewing angle of the VA type LCDs. The VA type TFT array substrate of the present invention disposes three pixel electrodes are formed in one pixel, which is beneficial of enhancing the viewing angle of the VA type LCDs.

For further understanding of the features and technical contents of the present invention, reference should be made to the following detailed description and accompanying drawings of the present invention. However, the drawings are for reference only and are not intended to limit the present invention.

BRIEF DESCRIPTION OF THE DRAWINGS

The technical solutions of the present invention and other beneficial effects will be apparent from the following detailed description of specific embodiments of the present invention with reference to the accompanying drawings.

In drawings.

DETAILED DESCRIPTION OF THE PREFERRED EMBODIMENTS

To further illustrate the technical solutions adopted by the present invention and the effects thereof, the following describes the preferred embodiments of the present invention and the accompanying drawings in detail.

Figure 1:
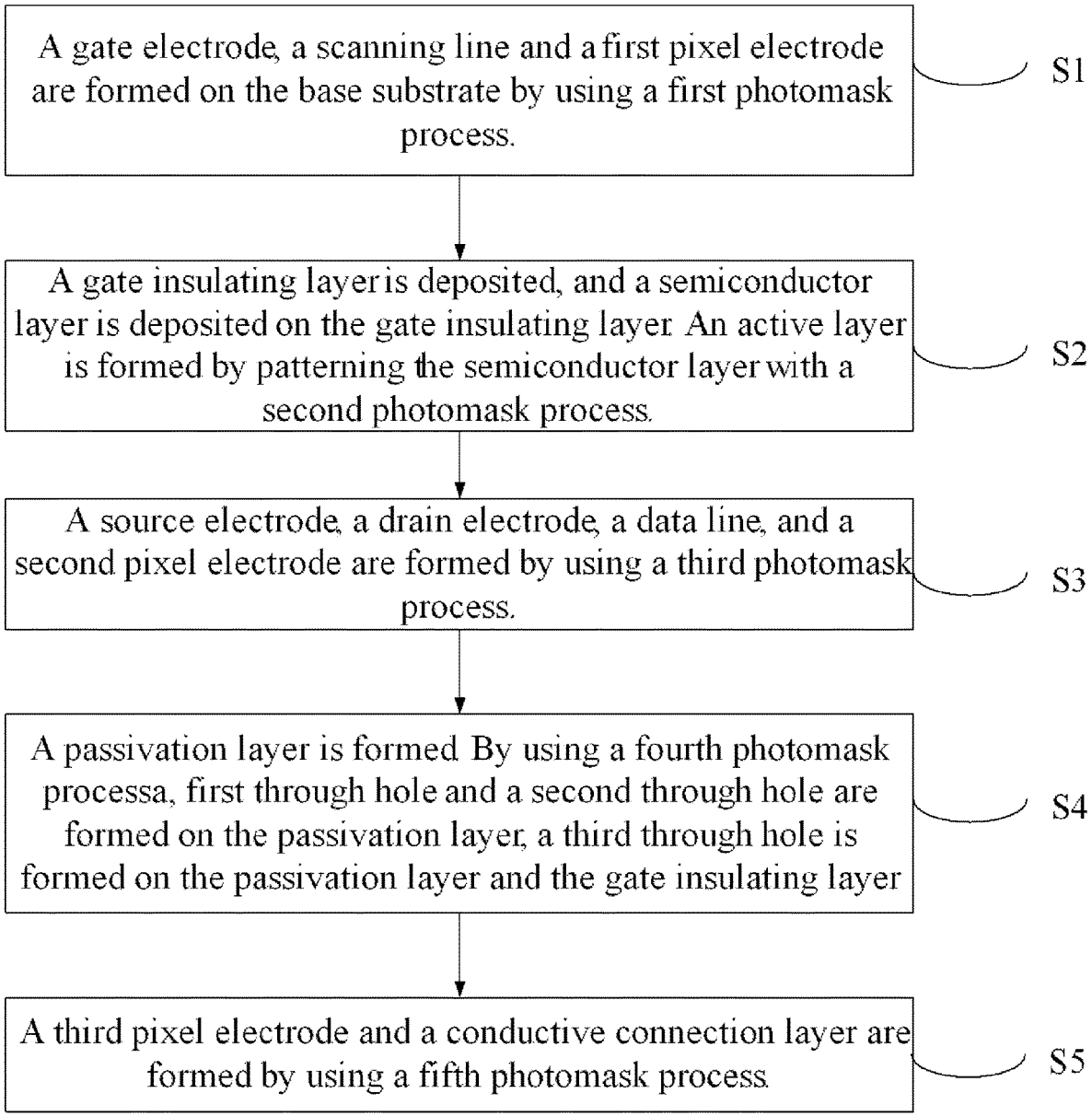
FIG. 1 is a flowchart of a manufacturing method for a VA type TFT array substrate according to the present invention.

Please refer to FIG. 1, the present invention provides a manufacturing method for an VA type TFT array substrate, which comprises below steps:

S1, as shown in FIGS. 2-5. A base substrate 10 is provided. A gate electrode 21, a scanning line 22, and a first pixel electrode 25 are formed on the base substrate 10 by using a first photomask process. The scanning line 22 is connected with the gate electrode 21. The common electrode 23 is connected with the common electrode line 24.

Figure 2:
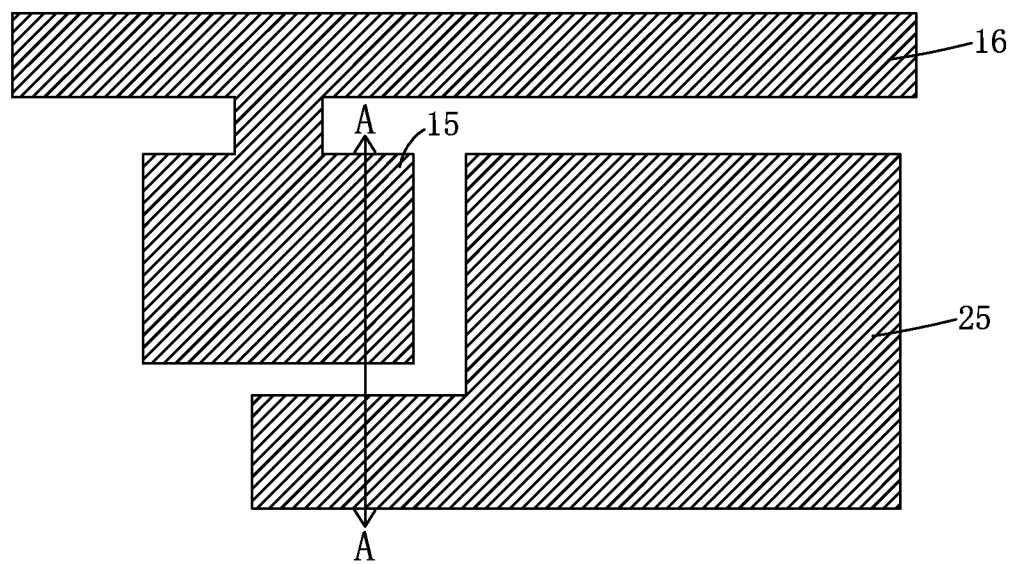
FIG. 2 is a schematic top view of a step S11 of the manufacturing method for a VA type TFT array substrate according to the present invention.
Figure 3:
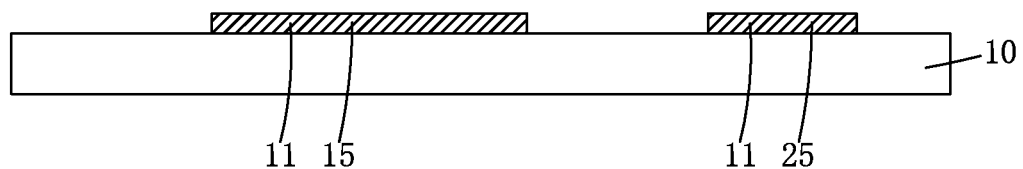
FIG. 3 is a schematic cross-sectional view along with A-A of FIG. 2.

Specifically, the S1 comprises:

S11, as shown in FIGS. 2-3. The base substrate 10 is provided. A first transparent conductive layer 11 is deposited on the base substrate 10. The first transparent conductive layer 11 is patterned by using the first photomask process, so as to obtain a predetermined pattern of the gate electrode 15 and a predetermined pattern of the scanning line 16, and the first pixel electrode line 25.

Figure 4:
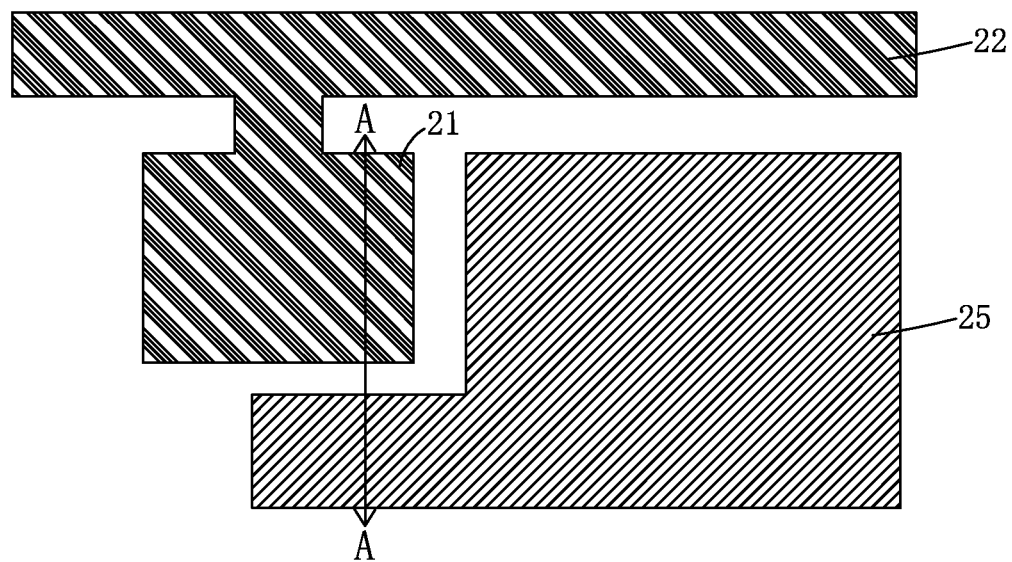
FIG. 4 is a schematic top view of a step S12 of the manufacturing method for a VA type TFT array substrate according to the present invention.
Figure 5:
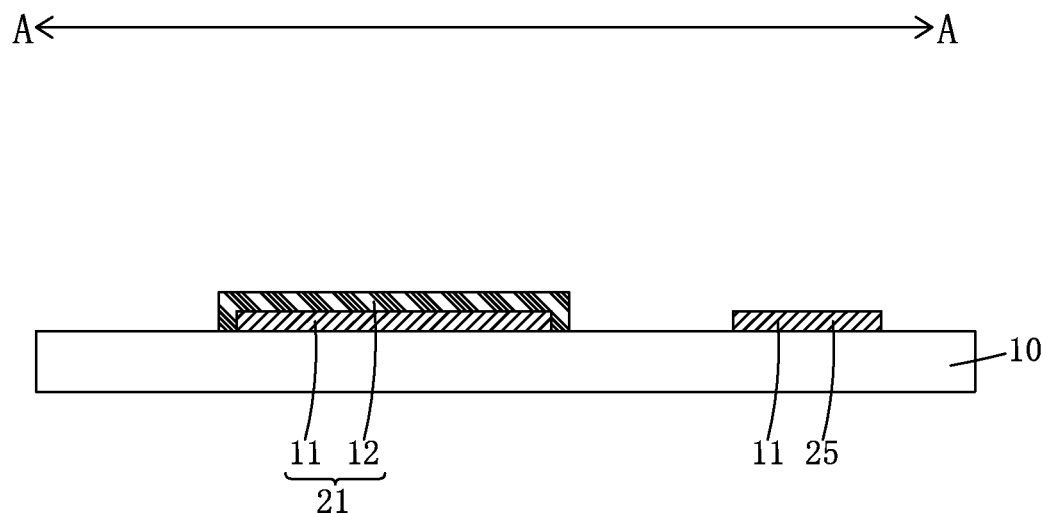
FIG. 5 is a schematic cross-sectional view along with A-A of FIG. 4.

S12, as shown in FIGS. 4-5. A first metal layer 12 is plated on the predetermined pattern of the gate electrode 15 and the predetermined pattern of the scanning line 16, so as to obtain the gate electrode 21 and the scanning line 22. A conductivity of the first metal layer 12 is greater than a conductivity of the first transparent conductive layer 11.

Specifically, the first transparent conductive layer 11 is selected from a group consisting of a transparent conductive metal oxide such as indium tin oxide (ITO), and the first transparent conductive layer 11 is deposited by PVD.

Specifically, the first metal layer 12 is selected from the group consisting of copper.

Because the first pixel electrode 25 does not need to have low resistance, the electrical performance requirement can be satisfied only by the first transparent conductive layer 11. Because the gate electrode 21 and the scanning line 22 need to have low resistance, the transparent conductive layer 11 is plated with the first metal layer 12 (it's better to be Copper) to have a better conductivity to prepare the gate electrode 21 and the scanning line 22, and the resistance value thereof can be reduced to meet the corresponding electrical performance requirements.

Specifically, a process of plating a first metal layer 12 on the predetermined pattern of the gate electrode 15 and the predetermined pattern of the scanning line 16 is an electroplating process. In the electroplating process, the predetermined pattern of the gate electrode 15 and the predetermined pattern of the scanning line 16 are electrically connected, however, the first pixel electrode 25 are electrically disconnected, so that the first metal layer 12 can be only plated on the predetermined pattern of the gate electrode 15 and the predetermined pattern of the scanning line 16, instead of being plated on the first pixel electrode 25.

Specifically, the base substrate 10 is a glass substrate.

Specifically, the first photomask process comprises processes of coating photoresist, exposure, development, dry etching and photoresist stripping.

Specifically, with plating the first metal layer 12 on the predetermined pattern of the gate electrode 15 and the predetermined pattern of the scanning line 16, the present invention can improve the conductivity performance of the gate electrode 21 and the scanning line 22.

Figure 6:
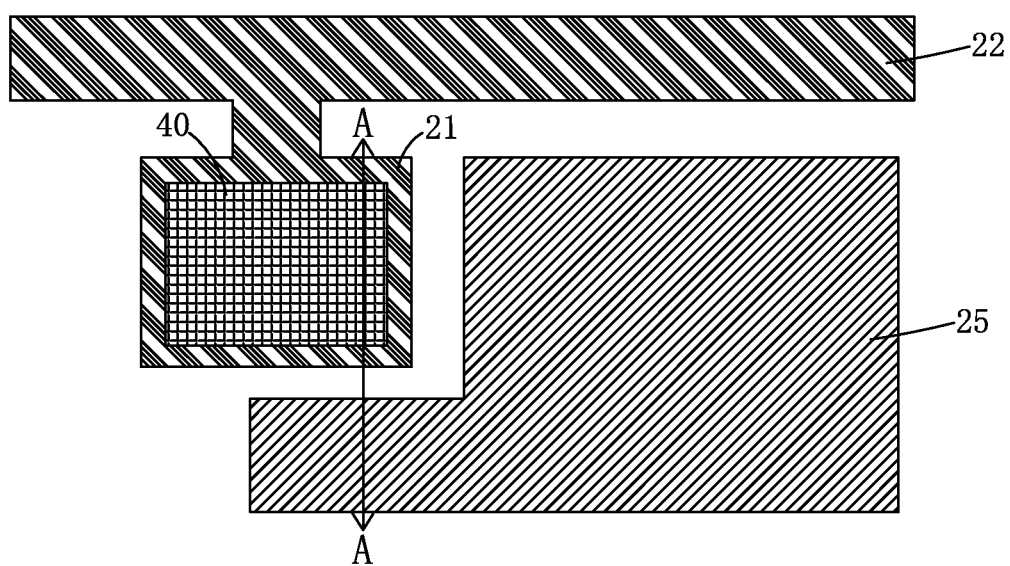
FIG. 6 is a schematic top view of a step S2 of the manufacturing method for a VA type TFT array substrate according to the present invention.
Figure 7:
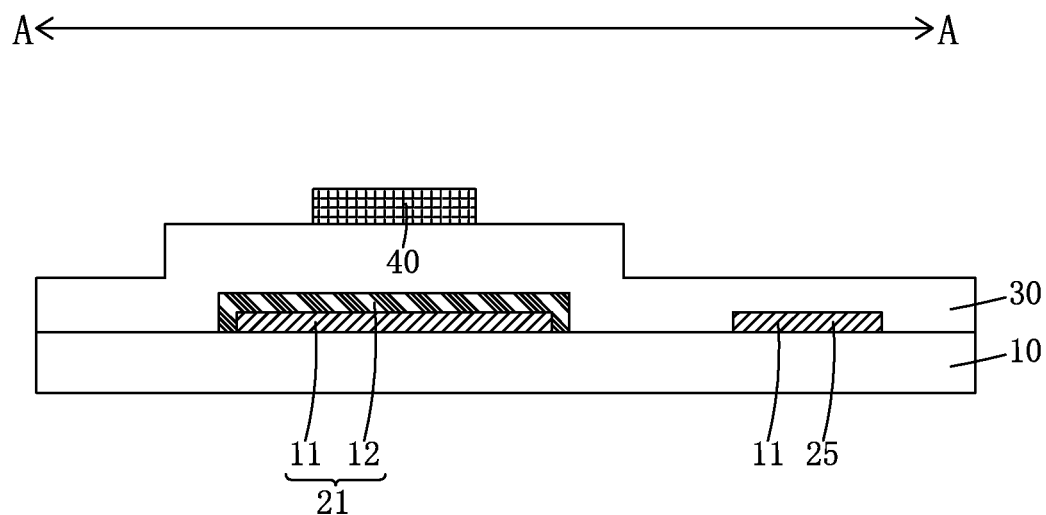
FIG. 7 is a schematic cross-sectional view along with A-A of FIG. 6.

S2, as shown in FIGS. 6-7. A gate insulating layer 30 is deposited on the gate electrode 21, the scanning line 22, the first pixel electrode 25, and the base substrate 10. A semiconductor layer 35 is deposited on the gate insulating layer 30. The semiconductor layer 35 is patterned by using a second photomask process, so as to obtain an active layer 40 corresponding onto the gate electrode 21.

Specifically, the gate insulating layer 30 is selected from the group consisting of silicon oxide (SiOx) and silicon nitride (SiNx).

Specifically, the semiconductor layer 35 is selected from the group consisting of amorphous silicon, polycrystalline silicon, and metal oxide.

Specifically, the gate insulating layer 30 and the semiconductor layer 35 are both deposited by chemical vapor deposition (CVD).

Specifically, the second photomask process comprises processes of coating photoresist, exposure, development, dry etching and photoresist stripping.

S3, as shown in FIGS. 8-11b. A drain electrode 51, a source electrode 52, a data line 53, and a second pixel electrode 55 are formed on the active layer 40 and the gate insulating layer 30 by using a third photomask process. The drain electrode 51 and the source electrode 52 are respectively in contact with the active layer 40. The data line 53 is connected with the source electrode 52. The drain electrode 51 is connected with the second pixel electrode 55.

Figure 8:
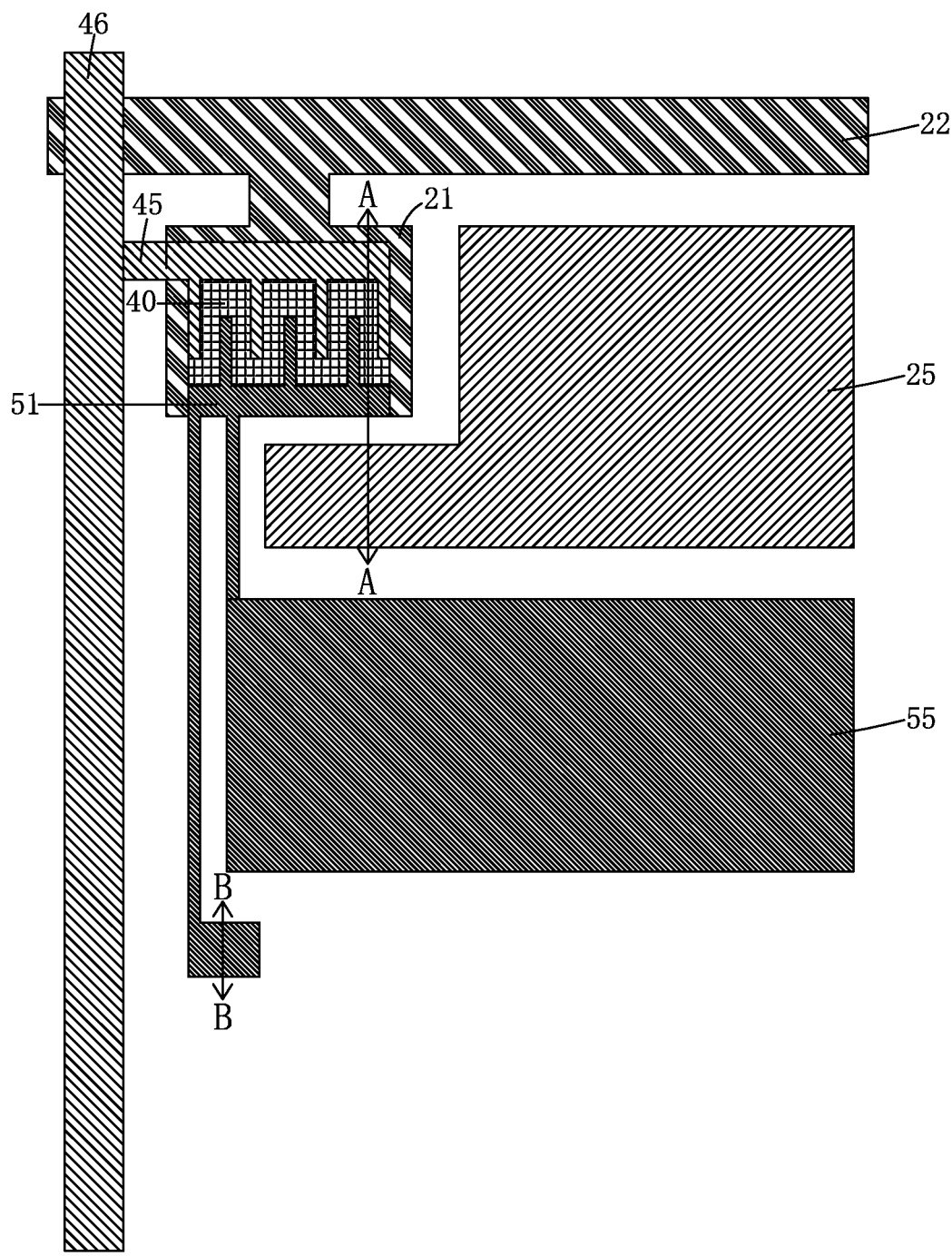
FIG. 8 is a schematic top view of a step S31 of the manufacturing method for a VA type TFT array substrate according to the present invention.
Figure 9A:
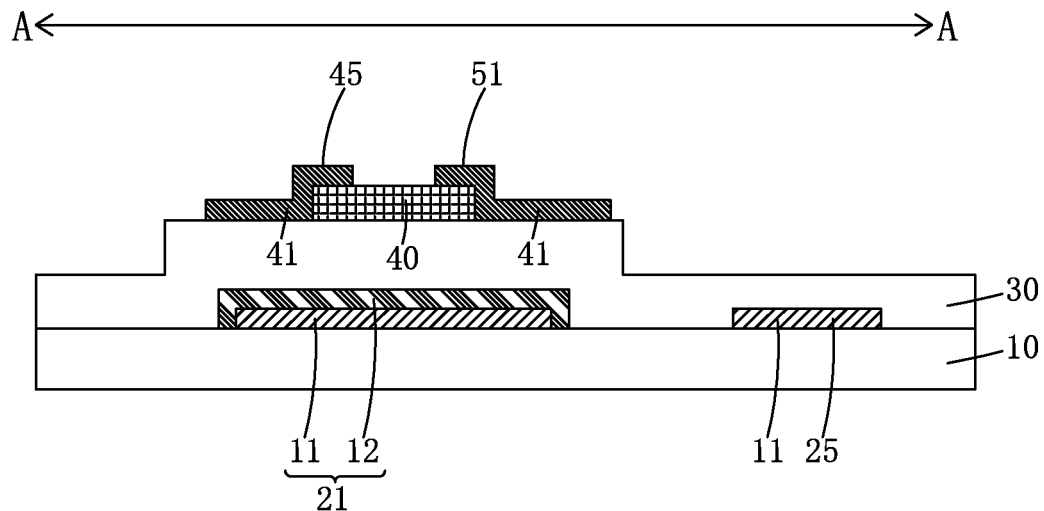
FIG. 9a is a schematic cross-sectional view along with A-A of FIG. 8.
Figure 9B:
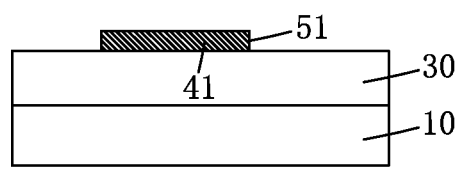
FIG. 9b is a schematic cross-sectional view along with B-B of FIG. 8.

Specifically, the S3 comprises:

S31, as shown in FIGS. 8, 9a, and 9b. A second transparent conductive layer 41 is deposited on the active layer 40 and the gate insulating layer 30. The second transparent conductive layer 41 is patterned by using the third photomask process, so as to obtain a predetermined pattern of the source electrode 45 and a predetermined pattern of the data line 46, the drain electrode 51, and the second pixel electrode 55.

Figure 10:
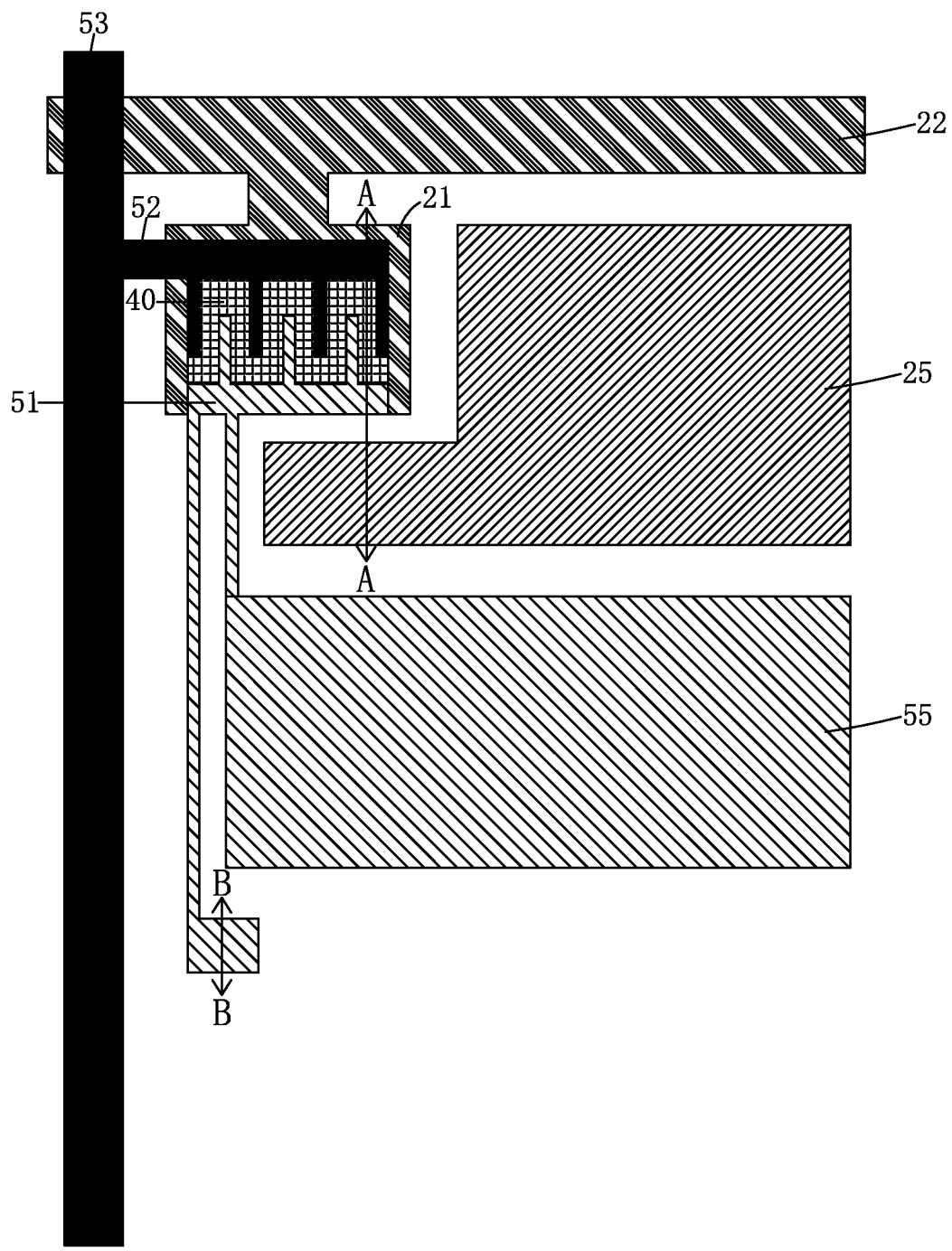
FIG. 10 is a schematic top view of a step S32 of the manufacturing method for a VA type TFT array substrate according to the present invention.
Figure 11A:
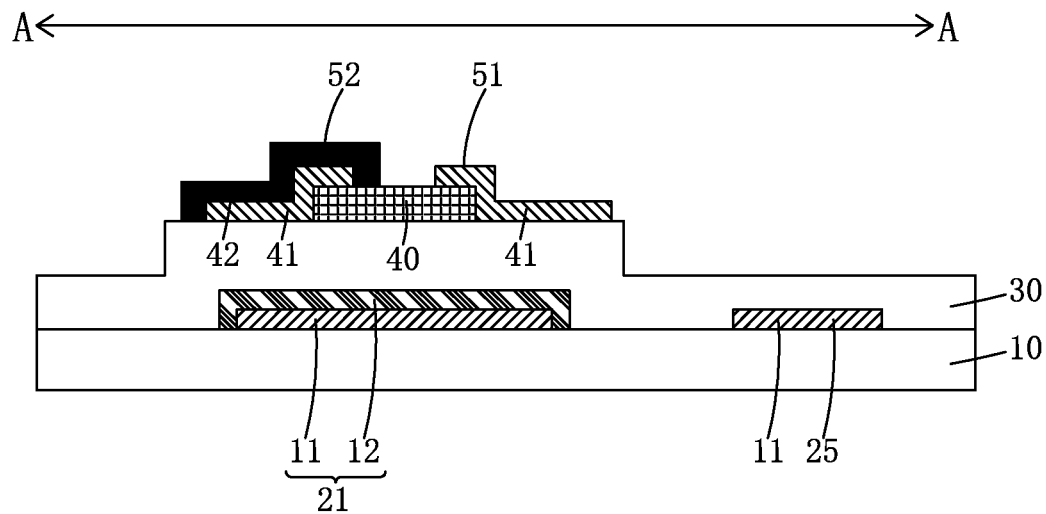
FIG. 11a is a schematic cross-sectional view along with A-A of FIG. 10.
Figure 11B:
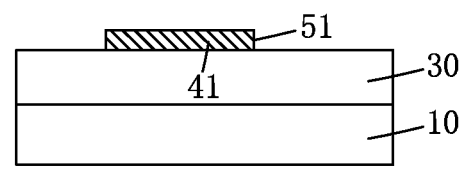
FIG. 11b is a schematic cross-sectional view along with B-B of FIG. 10.

S32, as shown in FIGS. 10, 11a, and 11b. A second metal layer 42 is plated on the predetermined pattern of the source electrode 45 and the predetermined pattern of the data line 46, so as to obtain the source electrode 52 and the data line 53. A conductivity of the second metal layer 42 is greater than a conductivity of the second transparent conductive layer 41.

Specifically, the second metal layer 42 is selected from the group consisting of copper.

Because the drain electrode 51 and the second pixel electrode 55 do not need to have low resistance, the electrical performance requirement can be satisfied only by the second transparent conductive layer 41. Because the source electrode 52 and the date line 53 need to have low resistance, the transparent conductive layer 11 is plated with the second metal layer 42 (it's better to be Copper) to have a better conductivity to prepare the source electrode 52 and the date line 53, and the resistance value thereof can be reduced to meet the corresponding electrical performance requirements. Specifically, a process of plating a second metal layer 12 on the predetermined pattern of the source electrode 45 and the predetermined pattern of the data line 46 is an electroplating process. In the electroplating process, the predetermined pattern of the source electrode 45 and the predetermined pattern of the data line 46 are electrically connected, however, the drain electrode 51 and the second pixel electrode 55 are electrically disconnected, so that the second metal layer 42 can be only plated on the predetermined pattern of the source electrode 45 and the predetermined pattern of the data line 46, instead of being plated on the drain electrode 51 and the second pixel electrode 55.

Specifically, the third photomask process comprises processes of coating photoresist, exposure, development, dry etching and photoresist stripping.

Specifically, with plating the first metal layer 12 on the predetermined pattern of the source electrode 45 and the predetermined pattern of the data line 46, the present invention can improve the conductivity performance of the source electrode 52 and the data line 53.

Figure 12:
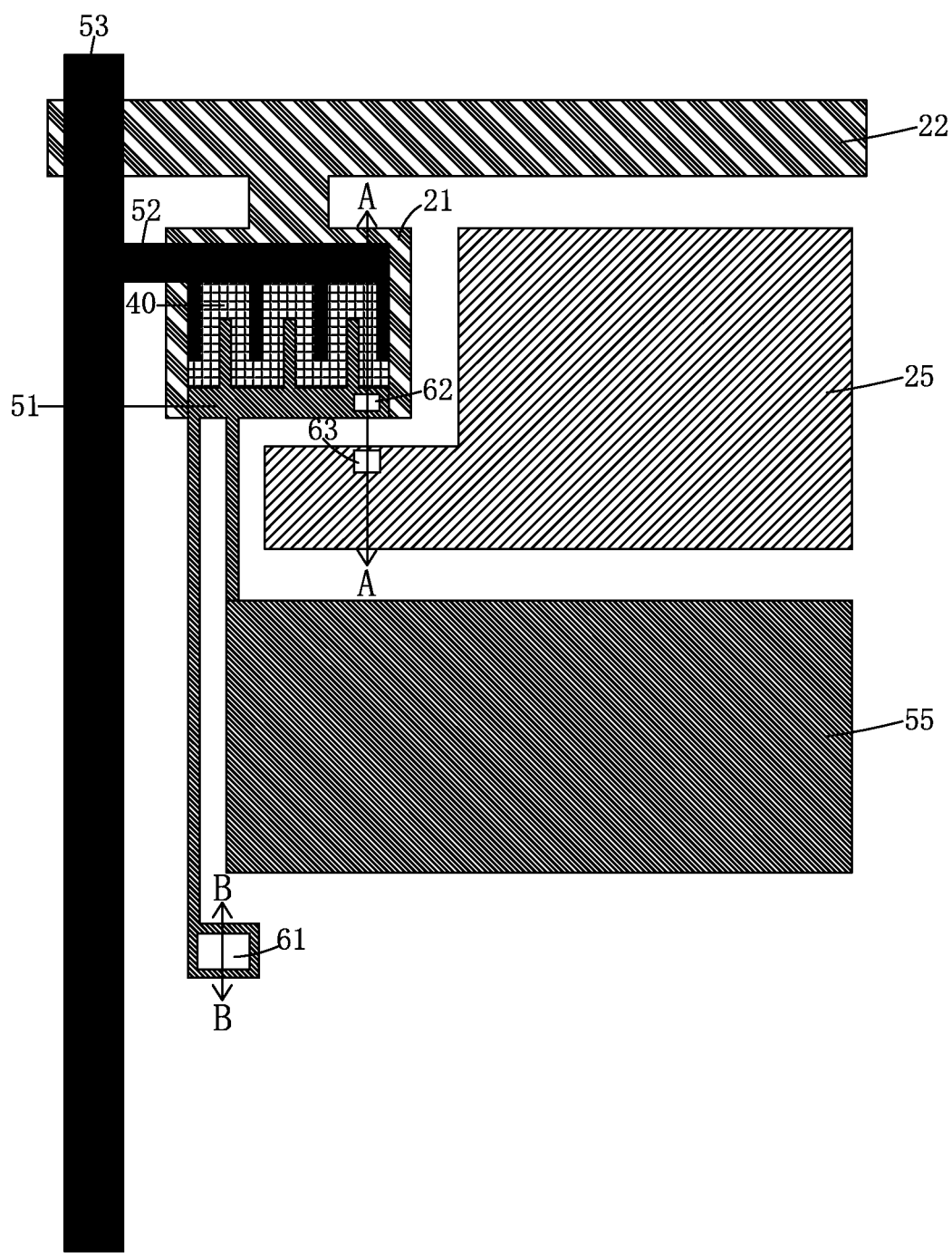
FIG. 12 is a schematic top view of a step S4 of the manufacturing method for a VA type TFT array substrate according to the present invention.
Figure 13A:
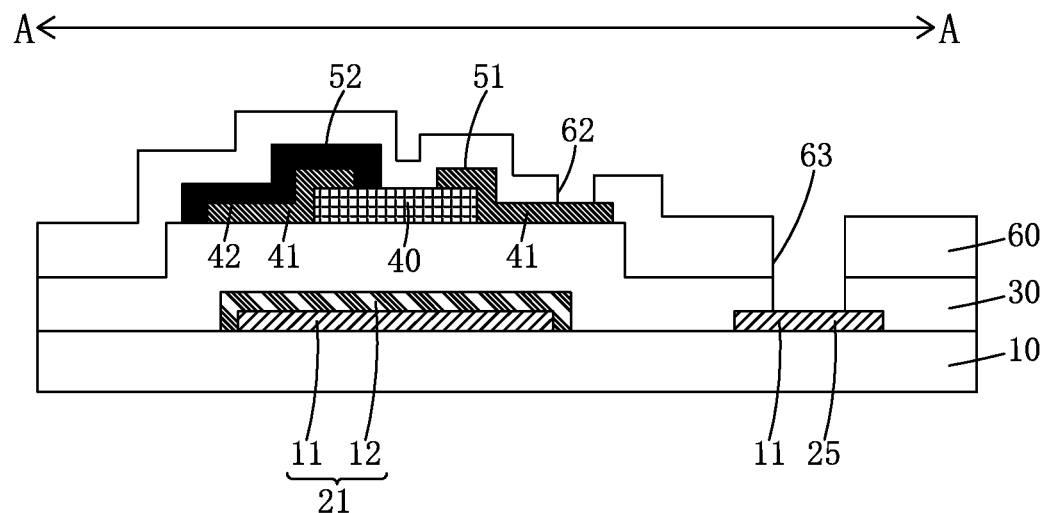
FIG. 13a is a schematic cross-sectional view along with A-A of FIG. 12.
Figure 13B:
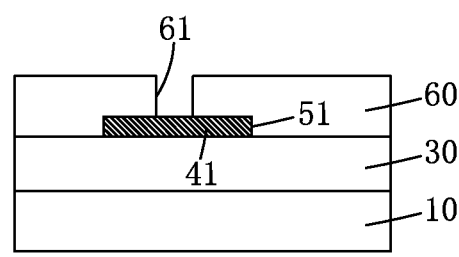
FIG. 13b is a schematic cross-sectional view along with B-B of FIG. 12.
Figure 14:
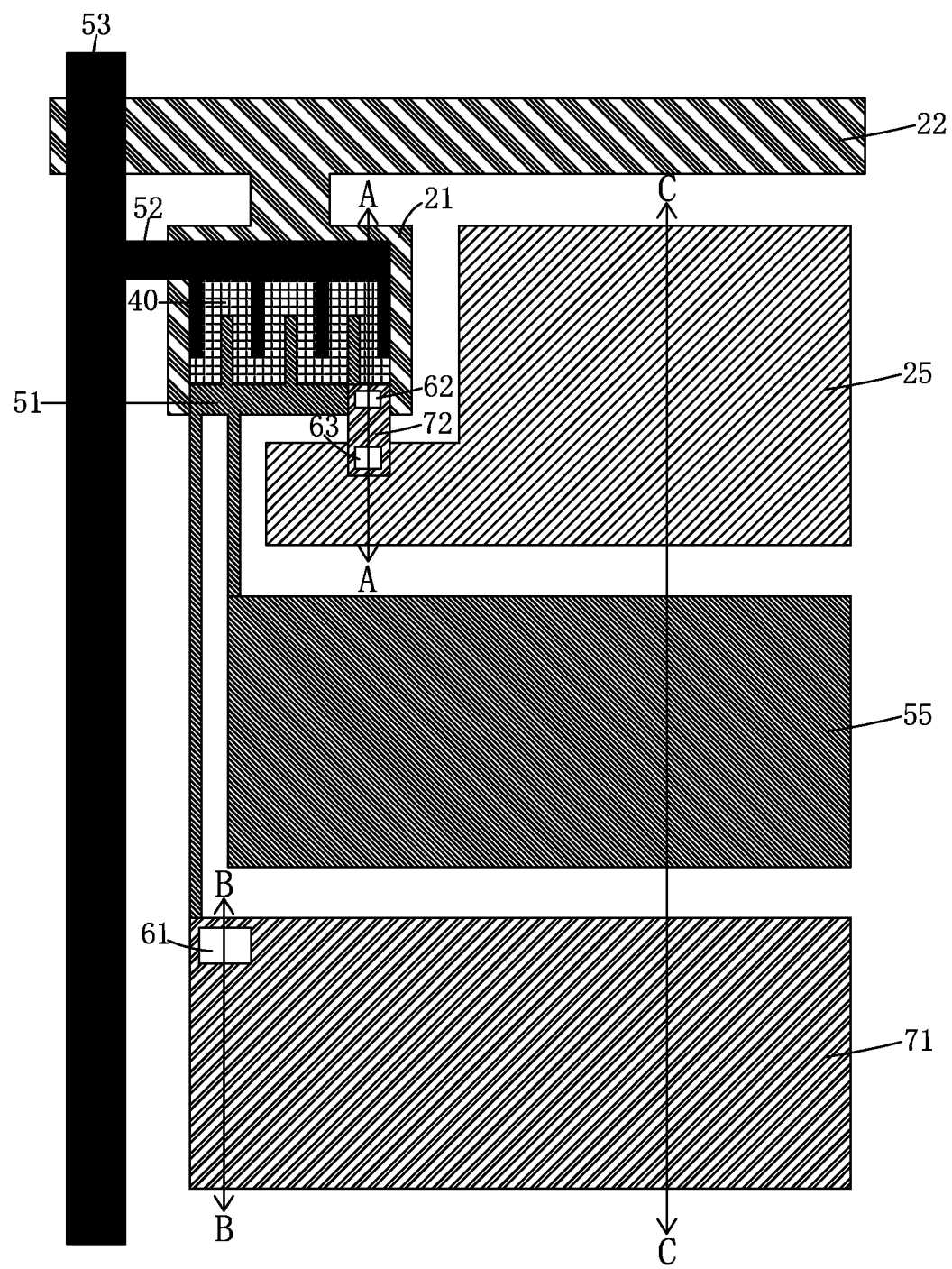
FIG. 14 is a schematic top view of a step S5 of the manufacturing method for a VA type TFT array substrate according to the present invention.
Figure 15A:
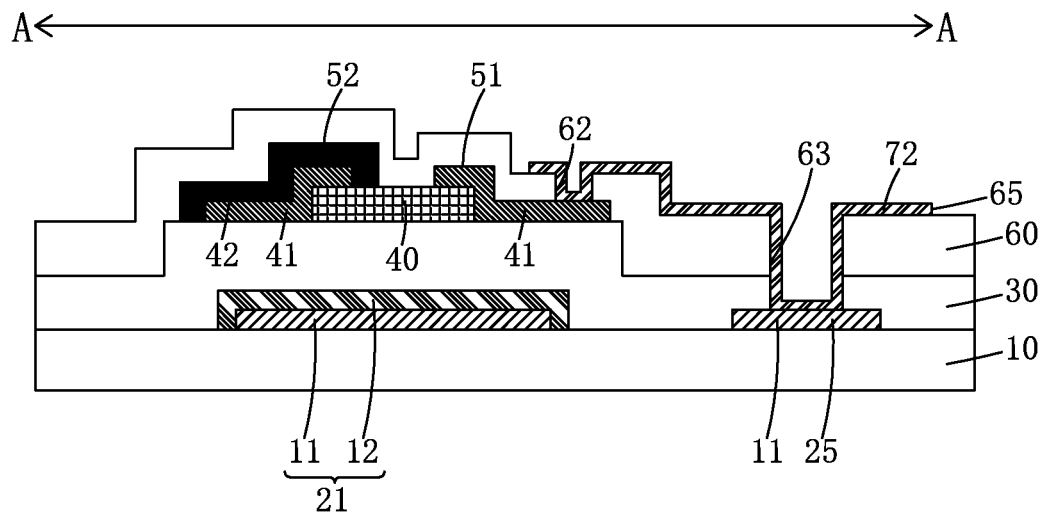
FIG. 15a is a schematic cross-sectional view along with A-A of FIG. 14.
Figure 15B:
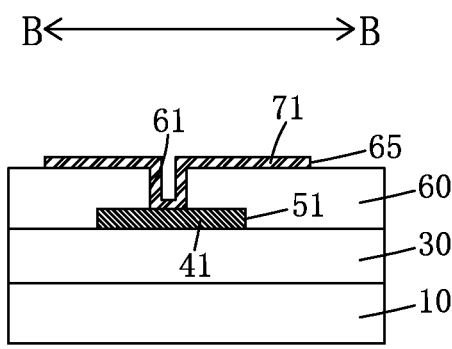
FIG. 15b is a schematic cross-sectional view along with B-B of FIG. 14.
Figure 15C:
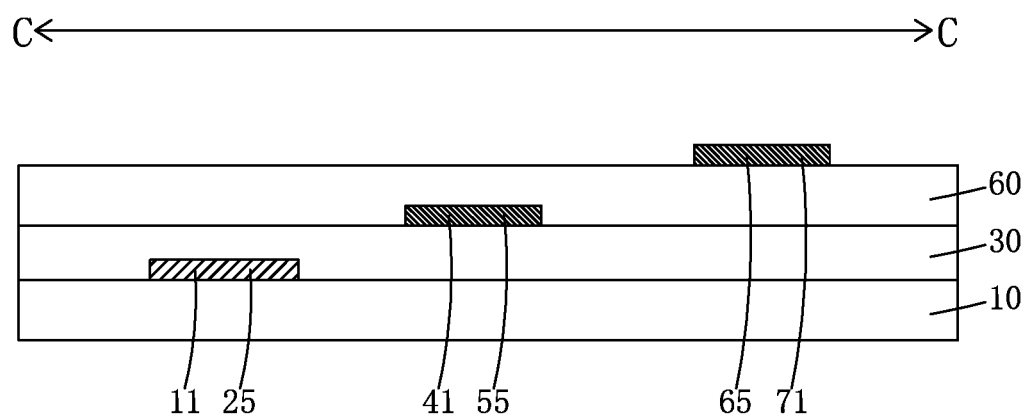
FIG. 15c is a schematic cross-sectional view along with C-C of FIG. 14.

S4, as shown in FIGS. 12, 13a, and 13b. A passivation layer 60 is formed on the source electrode 51, the drain electrode 52, the data line 53, the second pixel electrode 55, the active layer 40, and the gate insulating layer 30. The passivation layer 60 and the gate insulating layer 30 are patterned by using a fourth photomask process, so as to obtain a first through hole 61 and a second through hole 62 located on the passivation layer 60, and a third through hole 63 located on the passivation layer and the gate insulating layer. The first through hole 61 and the second through hole 62 are disposed corresponding onto the drain electrode 51. The third through hole 63 is corresponding onto the first pixel electrode 25.

Specifically, the fourth photomask process is a half-gray photomask process.

Specifically, the passivation layer 60 is selected from the group consisting of silicon oxide (SiOx) and silicon nitride (SiNx). The passivation layer 60 is formed by CVD.

Specifically, the fourth photomask process comprises processes of coating photoresist, exposure, development, dry etching and photoresist stripping.

S5, as shown in FIGS. 14, 15a, 15b, and 1c. A third transparent conductive layer 65 is deposited on the passivation layer 60, and the third transparent conductive layer 65 is patterned by using a fifth photomask process, so as to obtain a third pixel electrode 71 and a conductive connection layer 72. The third pixel electrode 71 is connected with the drain electrode 51 via the first through hole 61. The conductive connection layer 72 is connected with the drain electrode 51 via the second through hole 62 and connected with the first pixel electrode 25 via the third through hole 63, so that the drain electrode 51 and the first pixel electrode 25 are connected. So far, the VA type TFT array substrate is completed.

Specifically, the third transparent conductive layer 65 is selected from a group consisting of a transparent conductive metal oxide such as indium tin oxide (ITO), and the third transparent conductive layer 65 is deposited by PVD.

Specifically, the fifth photomask process comprises processes of coating photoresist, exposure, development, dry etching and photoresist stripping.

Specifically, the first pixel electrode 25, the second pixel electrode 55, and the third pixel electrode 71 are respectively located in three regions of the same pixel, and the three pixel electrodes are connected to the same TFT but located on different structural layers. After the frame forming process, the number of the dielectric layers between the liquid crystal above the VA type TFT array substrate and the three pixel electrodes are different, so that the drive capacities of the three pixel electrodes to the liquid crystal are different. The gate insulating layer 30, the passivation layer 60, and an alignment film (not shown) are disposed between the first pixel electrode 25 and the liquid crystal; the number of the dielectric layers between the first pixel electrode 25 and the liquid crystal is largest. Therefore, the first pixel electrode 25 has a worst driving capability on the liquid crystals. Only the alignment film (not shown) is disposed between the third pixel electrode 71 and the liquid crystal; the number of the dielectric layers between the third pixel electrode 71 and the liquid crystal is smallest. Therefore, the third pixel electrode 71 has a strongest driving capability on the liquid crystals. The passivation layer 60, and an alignment film (not shown) are disposed between the second pixel electrode 55 and the liquid crystal; the number of the dielectric layers between the second pixel electrode 25 and the liquid crystal is middle. Therefore, the second pixel electrode 55 has a middle driving capability on the liquid crystals.

The VA type TFT array substrate made by the present invention disposes three pixel electrodes are formed in one pixel, which are respectively the first pixel electrode 25, the second pixel electrode 55, and the third pixel electrode 71. The three pixel electrodes respectively drive the liquid crystals in three regions of the same pixel, because the driving capabilities of the three pixel electrodes to liquid crystals are different, the liquid crystal transmittances of three regions in one pixel are different, which is beneficial of keeping the brightness uniformity of the pixel when seeing from different angels, thereby enhancing the viewing angle of the VA type LCDs.

The manufacturing method for a VA type TFT array substrate of the present invention comprises that three pixel electrodes are formed in one pixel. The three pixel electrodes are connected to the same TFT but located on different structure layers. Therefore, the driving capabilities to liquid crystals are different. In the present invention, the three pixel electrodes are used to adjust the liquid crystal transmittances of three regions in one pixel, which is beneficial of keeping the brightness uniformity of the pixel when seeing from different angels, thereby enhancing the viewing angle of the VA type LCDs.

Please refer to FIGS. 14, 15a, 15b, and 15c. Based on the above manufacturing method for an VA type TFT array substrate, the present invention further provides an VA type TFT array substrate, which comprises:

A base substrate 10.

A gate electrode 21, a scanning line 22, and a first pixel electrode 25 are disposed on the base substrate 10. The scanning line 22 is connected with the gate electrode 21.

A gate insulating layer 30 is disposed on the gate electrode 21, the scanning line 22, first pixel electrode 25, and the base substrate 10.

An active layer 40 is disposed on the gate insulating layer 30 and corresponding onto the gate electrode 21.

A drain electrode 51 and a source electrode 52 are disposed on the active layer 40 and the gate insulating layer 30. A data line 53 and a second pixel electrode 55 are disposed on the gate insulating layer 30. The drain electrode 51 and the source electrode 52 are respectively in contact with the active layer 40. The data line 53 is connected with the source electrode 52. The drain electrode 51 is connected with the second pixel electrode A passivation layer 60 is disposed on the drain electrode 51, the source electrode 52, the data line 53, the second pixel electrode 55, the active layer 40, and the gate insulating layer 30. A first through hole 61 and a second through hole 62 are disposed on the passivation layer 60, a third through hole 63 is disposed on the passivation layer 60 and the gate insulating layer 30. The first through hole 61 and the second through hole 62 are disposed corresponding onto the drain electrode 51. The third through hole 63 is disposed corresponding onto the first pixel electrode 25.

A third pixel electrode 71 and a conductive connection layer 72 are disposed on the passivation layer 60. The third pixel electrode 71 is connected with the drain electrode 51 via the first through hole 61. The conductive connection layer 72 is connected with the drain electrode 51 via the second through hole 62 and connected with the first pixel electrode 25 via the third through hole 63, so that the drain electrode 51 and the first pixel electrode 25 are connected.

Specifically, the base substrate 10 is a glass substrate.

Specifically, the first pixel electrode 25 comprises a first transparent conductive layer 11. The gate electrode 21 and the scanning line 22 comprise the first transparent conductive layer 11 and a first metal layer 12 on the first transparent conductive layer 11. A conductivity of the first metal layer 12 is greater than a conductivity of the first transparent conductive layer 11.

Specifically, the first transparent conductive layer 11 is selected from a group consisting of a transparent conductive metal oxide such as ITO. The first metal layer 12 is selected from the group consisting of copper.

Specifically, the second pixel electrode 55 and the drain electrode 51 comprise a second transparent conductive layer 41. The source electrode 52 and the data line 53 comprise the second transparent conductive layer 41 and a second metal layer 42 on the second transparent conductive layer 41. A conductivity of the second metal layer 42 is greater than a conductivity of the second transparent conductive layer 41.

Specifically, the second transparent conductive layer 41 is selected from a group consisting of a transparent conductive metal oxide such as ITO. The second metal layer 42 is selected from the group consisting of copper.

Specifically, the gate insulating layer 30 is selected from the group consisting of silicon oxide (SiOx) and silicon nitride (SiNx).

Specifically, the active layer 40 is selected from the group consisting of amorphous silicon, polycrystalline silicon, and metal oxide.

Specifically, the passivation layer 60 is selected from the group consisting of silicon oxide (SiOx) and silicon nitride (SiNx).

Specifically, the first pixel electrode 25, the second pixel electrode 55, and the third pixel electrode 71 are respectively disposed on three regions of the same pixel.

Specifically, the third pixel electrode 71 is selected from a group consisting of a transparent conductive metal oxide such as ITO.

The VA type TFT array substrate of the present invention disposes three pixel electrodes are formed in one pixel. The three pixel electrodes are connected to the same TFT but located on different structure layers. Therefore, the driving capabilities to liquid crystals are different. In the present invention, the three pixel electrodes are used to adjust the liquid crystal transmittances of three regions in one pixel, which is beneficial of keeping the brightness uniformity of the pixel when seeing from different angels, thereby enhancing the viewing angle of the VA type LCDs.

As mentioned above, the present invention provides a VA type TFT array substrate and a manufacturing thereof. The manufacturing method for a VA type TFT array substrate of the present invention comprises that three pixel electrodes are formed in one pixel. The three pixel electrodes are connected to the same TFT but located on different structure layers. Therefore, the driving capabilities to liquid crystals are different. In the present invention, the three pixel electrodes are used to adjust the liquid crystal transmittances of three regions in one pixel, which is beneficial of keeping the brightness uniformity of the pixel when seeing from different angels, thereby enhancing the viewing angle of the VA type LCDs. The VA type TFT array substrate of the present invention disposes three pixel electrodes are formed in one pixel, which is beneficial of enhancing the viewing angle of the VA type LCDs.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A manufacturing method for a vertical alignment (VA) type thin film transistor (TFT) array substrate, comprising:
    S1, providing a base substrate, and forming a gate electrode, a scanning line, and a first pixel electrode on the base substrate by using a first photomask process; wherein the scanning line is connected with the gate electrode;
    S2, depositing a gate insulating layer on the gate electrode, the scanning line, the first pixel electrode, and the base substrate; depositing a semiconductor layer on the gate insulating layer, patterning the semiconductor layer by using a second photomask process, so as to obtain an active layer corresponding onto the gate electrode;
    S3, forming a drain electrode, a source electrode, a data line, and a second pixel electrode on the active layer and the gate insulating layer by using a third photomask process; wherein, the drain electrode and the source electrode are respectively in contact with the active layer; the data line is connected with the source electrode, the drain electrode is connected with the second pixel electrode;
    S4, forming a passivation layer on the drain electrode, the source electrode, the data line, the second pixel electrode, the active layer, and the gate insulating layer, patterning the passivation layer and the gate insulating layer by using a fourth photomask process, so as to obtain a first through hole and a second through hole located on the passivation layer, and a third through hole located on the passivation layer and the gate insulating layer; wherein the first through hole and the second through hole are corresponding onto the drain electrode, the third through hole is corresponding onto the first pixel electrode;
    S5, depositing a third transparent conductive layer on the passivation layer, and patterning the third transparent conductive layer by using a fifth photomask process, so as to obtain a third pixel electrode and a conductive connection layer; wherein the third pixel electrode is connected with the drain electrode via the first through hole, the conductive connection layer is connected with the drain electrode via the second through hole and connected with the first pixel electrode via the third through hole, so that the drain electrode and the first pixel electrode are connected.

2. The manufacturing method for a VA type TFT array substrate according to claim 1, wherein the S1 specifically comprises:
    S11, providing the base substrate and depositing a first transparent conductive layer on the base substrate, patterning the first transparent conductive layer by using the first photomask process, so as to obtain a predetermined pattern of the gate electrode and a predetermined pattern of the scanning line, and the first pixel electrode;
    S12, plating a first metal layer on the predetermined pattern of the gate electrode and the predetermined pattern of the scanning line, so as to obtain the gate electrode and the scanning line; wherein a conductivity of the first metal layer is greater than a conductivity of the first transparent conductive layer.

3. The manufacturing method for a VA type TFT array substrate according to claim 2, wherein the first transparent conductive layer is selected from the group consisting of transparent conductive metal oxide; and the first metal layer is selected from the group consisting of copper; a process of plating a first metal layer on the predetermined pattern of the gate electrode and the predetermined pattern of the scanning line is an electroplating process.

4. The manufacturing method for a VA type TFT array substrate according to claim 1, wherein the S3 specifically comprises:
    S31, depositing a second transparent conductive layer on the active layer and the gate insulating layer, patterning the second transparent conductive layer by using the third photomask process, so as to obtain a predetermined pattern of the source electrode and a predetermined pattern of the data line, the drain electrode, and the second pixel electrode;
    S32, plating a second metal layer on the predetermined pattern of the source electrode and the predetermined pattern of the data line, so as to obtain the source electrode and the data line; wherein a conductivity of the second metal layer is greater than a conductivity of the second transparent conductive layer.

5. The manufacturing method for a VA type TFT array substrate according to claim 4, wherein the second transparent conductive layer is selected from the group consisting of transparent conductive metal oxide; and the second metal layer is selected from the group consisting of copper; a process of plating a second metal layer on the predetermined pattern of the source electrode and the predetermined pattern of the data line is an electroplating process.

6. A vertical alignment (VA) type thin film transistor (TFT) array substrate, comprising:
    a base substrate;
    a gate electrode, a scanning line, and a first pixel electrode being disposed on the base substrate; wherein the scanning line is connected with the gate electrode;
    a gate insulating layer being disposed on the gate electrode, the scanning line, the first pixel electrode, and the base substrate;
    an active layer being disposed on the gate insulating layer and corresponding onto the gate electrode;
    a drain electrode and a source electrode being disposed on the active layer and the gate insulating layer, a data line and a second pixel electrode being disposed on the gate insulating layer; wherein, the drain electrode and the source electrode are respectively in contact with the active layer; the data line is connected with the source electrode, the drain electrode is connected with the second pixel electrode;
    a passivation layer being disposed on the drain electrode, the source electrode, the data line, the second pixel electrode, the active layer, and the gate insulating layer;
    a first through hole and a second through hole being disposed on the passivation layer, a third through hole being disposed on the passivation layer and the gate insulating layer; the first through hole and the second through hole being disposed corresponding onto the drain electrode, the third through hole being disposed corresponding onto the first pixel electrode;

a third pixel electrode and a conductive connection layer being disposed on the passivation layer; wherein the third pixel electrode is connected with the drain electrode via the first through hole, the conductive connection layer is connected with the drain electrode via the second through hole and connected with the first pixel electrode via the third through hole, so that the drain electrode and the first pixel electrode are connected.

7. The VA type TFT array substrate according to claim 6, wherein the first pixel electrode comprises a first transparent conductive layer, the gate electrode and the scanning line comprise the first transparent conductive layer and a first metal layer on the first transparent conductive layer; wherein a conductivity of the first metal layer is greater than a conductivity of the first transparent conductive layer.

8. The VA type TFT array substrate according to claim 7, wherein the first transparent conductive layer is selected from the group consisting of transparent conductive metal oxide; and the first metal layer is selected from the group consisting of copper.

9. The VA type TFT array substrate according to claim 6, wherein the second pixel electrode and the drain electrode comprise a second transparent conductive layer, the source electrode and the data line comprise the second transparent conductive layer and a second metal layer on the second transparent conductive layer;
wherein a conductivity of the second metal layer is greater than a conductivity of the second transparent conductive layer.

10. The VA type TFT array substrate according to claim 9, wherein the second transparent conductive layer is selected from the group consisting of transparent conductive metal oxide; and the second metal layer is selected from the group consisting of copper.

11. A manufacturing method for a vertical alignment (VA) type thin film transistor (TFT) array substrate, comprising:
S1, providing a base substrate, and forming a gate electrode, a scanning line, and a first pixel electrode on the base substrate by using a first photomask process; wherein the scanning line is connected with the gate electrode;
S2, depositing a gate insulating layer on the gate electrode, the scanning line, the first pixel electrode, and the base substrate; depositing a semiconductor layer on the gate insulating layer, patterning the semiconductor layer by using a second photomask process, so as to obtain an active layer corresponding onto the gate electrode;
S3, forming a drain electrode, a source electrode, a data line, and a second pixel electrode on the active layer and the gate insulating layer by using a third photomask process; wherein, the drain electrode and the source electrode are respectively in contact with the active layer; the data line is connected with the source electrode, the drain electrode is connected with the second pixel electrode;
S4, forming a passivation layer on the drain electrode, the source electrode, the data line, the second pixel electrode, the active layer, and the gate insulating layer, patterning the passivation layer and the gate insulating layer by using a fourth photomask process, so as to obtain a first through hole and a second through hole located on the passivation layer, and a third through hole located on the passivation layer and the gate insulating layer; wherein the first through hole and the second through hole are corresponding onto the drain electrode, the third through hole is corresponding onto the first pixel electrode;
S5, depositing a third transparent conductive layer on the passivation layer, and patterning the third transparent conductive layer by using a fifth photomask process, so as to obtain a third pixel electrode and a conductive connection layer; wherein the third pixel electrode is connected with the drain electrode via the first through hole, the conductive connection layer is connected with the drain electrode via the second through hole and connected with the first pixel electrode via the third through hole, so that the drain electrode and the first pixel electrode are connected;
wherein the S1 specifically comprises:
S11, providing the base substrate and depositing a first transparent conductive layer on the base substrate, patterning the first transparent conductive layer by using the first photomask process, so as to obtain a predetermined pattern of the gate electrode and a predetermined pattern of the scanning line, and the first pixel electrode;
S12, plating a first metal layer on the predetermined pattern of the gate electrode and the predetermined pattern of the scanning line, so as to obtain the gate electrode and the scanning line; wherein a conductivity of the first metal layer is greater than a conductivity of the first transparent conductive layer;
wherein the first transparent conductive layer is selected from the group consisting of transparent conductive metal oxide; and the first metal layer is selected from the group consisting of copper; a process of plating a first metal layer on the predetermined pattern of the gate electrode and the predetermined pattern of the scanning line is an electroplating process;
wherein the S3 specifically comprises:
S31, depositing a second transparent conductive layer on the active layer and the gate insulating layer, patterning the second transparent conductive layer by using the third photomask process, so as to obtain a predetermined pattern of the source electrode and a predetermined pattern of the data line, the drain electrode, and the second pixel electrode;
S32, plating a second metal layer on the predetermined pattern of the source electrode and the predetermined pattern of the data line, so as to obtain the source electrode and the data line; wherein a conductivity of the second metal layer is greater than a conductivity of the second transparent conductive layer;
wherein the second transparent conductive layer is selected from the group consisting of transparent conductive metal oxide; and the second metal layer is selected from the group consisting of copper; a process of plating a second metal layer on the predetermined pattern of the source electrode and the predetermined pattern of the data line is an electroplating process.

\* \* \* \* \*